US008219960B1

(12) United States Patent
Neuendorffer et al.

(10) Patent No.: US 8,219,960 B1
(45) Date of Patent: Jul. 10, 2012

(54) METHODS OF IMPLEMENTING RELOCATABLE CIRCUITS IN A PROGRAMMABLE INTEGRATED CIRCUIT DEVICE

(75) Inventors: Stephen A. Neuendorffer, San Jose, CA (US); Parimal Patel, San Antonio, TX (US)

(73) Assignee: Xilinx, Inc., San Jose, CA (US)

( * ) Notice: Subject to any disclaimer, the term of this patent is extended or adjusted under 35 U.S.C. 154(b) by 289 days.

(21) Appl. No.: 12/768,933

(22) Filed: Apr. 28, 2010

Related U.S. Application Data

(62) Division of application No. 12/054,724, filed on Mar. 25, 2008, now Pat. No. 7,765,512.

(51) Int. Cl.
G06F 17/50 (2006.01)

(52) U.S. Cl. ........ 716/128; 716/117; 716/121; 710/305; 711/165; 712/37; 326/41

(58) Field of Classification Search ................... 716/117, 716/121, 128; 710/305; 711/165; 712/37; 326/41
See application file for complete search history.

(56) References Cited

U.S. PATENT DOCUMENTS

| | | | | |
|---|---|---|---|---|
| 4,037,215 A | | 7/1977 | Birney et al. | |
| 5,153,886 A | * | 10/1992 | Tuttle | 714/819 |
| 5,659,466 A | | 8/1997 | Norris et al. | |
| 5,682,512 A | * | 10/1997 | Tetrick | 711/202 |
| 5,684,997 A | | 11/1997 | Kau et al. | |
| 5,737,542 A | * | 4/1998 | Kurihara et al. | 710/301 |
| 5,784,636 A | | 7/1998 | Rupp | |
| 5,822,550 A | | 10/1998 | Milhaupt et al. | |
| 6,128,718 A | * | 10/2000 | Schmisseur et al. | 711/212 |
| 6,289,434 B1 | | 9/2001 | Roy | |
| 6,397,379 B1 | * | 5/2002 | Yates et al. | 717/140 |
| 6,467,009 B1 | | 10/2002 | Winegarden et al. | |
| 6,546,483 B1 | * | 4/2003 | Lai | 713/1 |
| 6,578,123 B1 | | 6/2003 | Austin et al. | |
| 6,919,736 B1 | | 7/2005 | Agrawal et al. | |
| 6,973,405 B1 | | 12/2005 | Ansari | |
| 7,096,305 B2 | * | 8/2006 | Moll | 710/312 |
| 7,243,167 B2 | * | 7/2007 | Zimmer et al. | 710/10 |
| 7,243,212 B1 | | 7/2007 | Purcell et al. | |
| 7,278,008 B1 | * | 10/2007 | Case et al. | 711/209 |
| 7,313,775 B2 | * | 12/2007 | Casey et al. | 716/117 |
| 7,370,310 B1 | * | 5/2008 | Saini et al. | 716/128 |
| 7,653,762 B1 | | 1/2010 | Neuendorffer et al. | |
| 2007/0075736 A1 | * | 4/2007 | Goodnow et al. | 326/41 |

OTHER PUBLICATIONS

U.S. Appl. No. 12/054,724, filed Mar. 25, 2008, Neuendorffer et al.

* cited by examiner

Primary Examiner — Naum Levin
(74) Attorney, Agent, or Firm — LeRoy D. Maunu

(57) ABSTRACT

A method for configuring programmable logic in an IC to implement instances of a relocatable circuit includes, for each instance, assigning a respective portion of an address space of a processor to the instance, configuring a respective interface circuit for translating the transactions accessing the respective portion of the address space into a fixed address space of the relocatable circuit, and selecting a respective region within an array of programmable logic and interconnect resources of the IC. The processor accesses the address space with read and write transactions issued on an interface bus. The relocatable circuit is independent of the address space assigned to the instances. Each region is configurable to implement an instance. The programmable logic and interconnect resources are configured to implement the instances and to couple each instance to the interface bus of the processor via the respective interface circuit, using a single copy of configuration data for the relocatable circuit.

19 Claims, 6 Drawing Sheets

METHODS OF IMPLEMENTING RELOCATABLE CIRCUITS IN A PROGRAMMABLE INTEGRATED CIRCUIT DEVICE

FIELD OF THE INVENTION

The present invention generally relates to circuits implemented in programmable logic, and more particularly to relocatable circuits implemented in a programmable integrated circuit.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

The functionality of PLDs is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell. There is a general need to increase the efficiency of controlling the functionality of a PLD for implementing a specified logic functions.

The present invention may address one or more of the above issues.

SUMMARY OF THE INVENTION

Various embodiments of the invention provide a circuit implemented using a programmable logic device (PLD). The circuit includes a processor, a configuration port, a relocatable circuit, and an interface circuit. The processor accesses an address space using read and write transactions issued on an interface bus. The configuration port of the PLD is coupled to an array of programmable logic and interconnect resources of the PLD. The programmable logic and interconnect resources are configurable via the configuration port. The relocatable circuit is implemented in a selected region within the array. The relocatable circuit is implemented in the selected region by configuring the programmable logic and interconnect resources in the selected region with configuration data via the configuration port. The interface circuit is coupled between the interface bus and the relocatable circuit. The interface circuit translates the transactions accessing a portion of the address space assigned to the relocatable circuit into a fixed address space of the relocatable circuit. The configuration data for implementing the relocatable circuit is independent of the portion of the address space assigned to the relocatable circuit.

Various other embodiments of the invention provide a method for configuring a programmable logic device (PLD) to implement instances of a relocatable circuit. A respective portion of an address space of a processor is assigned to each instance of the relocatable circuit. The processor accesses the address space with read and write transactions issued on an interface bus. A respective interface circuit for each instance translates the transactions accessing the respective portion of the address space into a fixed address space of the relocatable circuit. The relocatable circuit is independent of the respective portions of the address space assigned to the instances of the relocatable circuit. A respective region for each instance is selected a within an array of programmable logic and interconnect resources of the PLD. Every one of the regions is configurable to implement an instance of the relocatable circuit. The programmable logic and interconnect resources are configured to implement the instances of the relocatable circuit and to couple each of the instances to the interface bus of the processor via the respective interface circuit. The processor configures the programmable logic and interconnect resources in the respective regions to implement the instances from a single copy of configuration data for implementing the relocatable circuit.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Embodiments of the present invention are applicable to many types of integrated circuits that include programmable logic. However, examples of some embodiments of the present invention are described in relation to application in Field Programmable Gate Arrays (FPGAs). These exemplary descriptions are not intended to limit embodiments of the present invention, but to illuminate them in the context of very complex integrated circuits.

Figure 1:
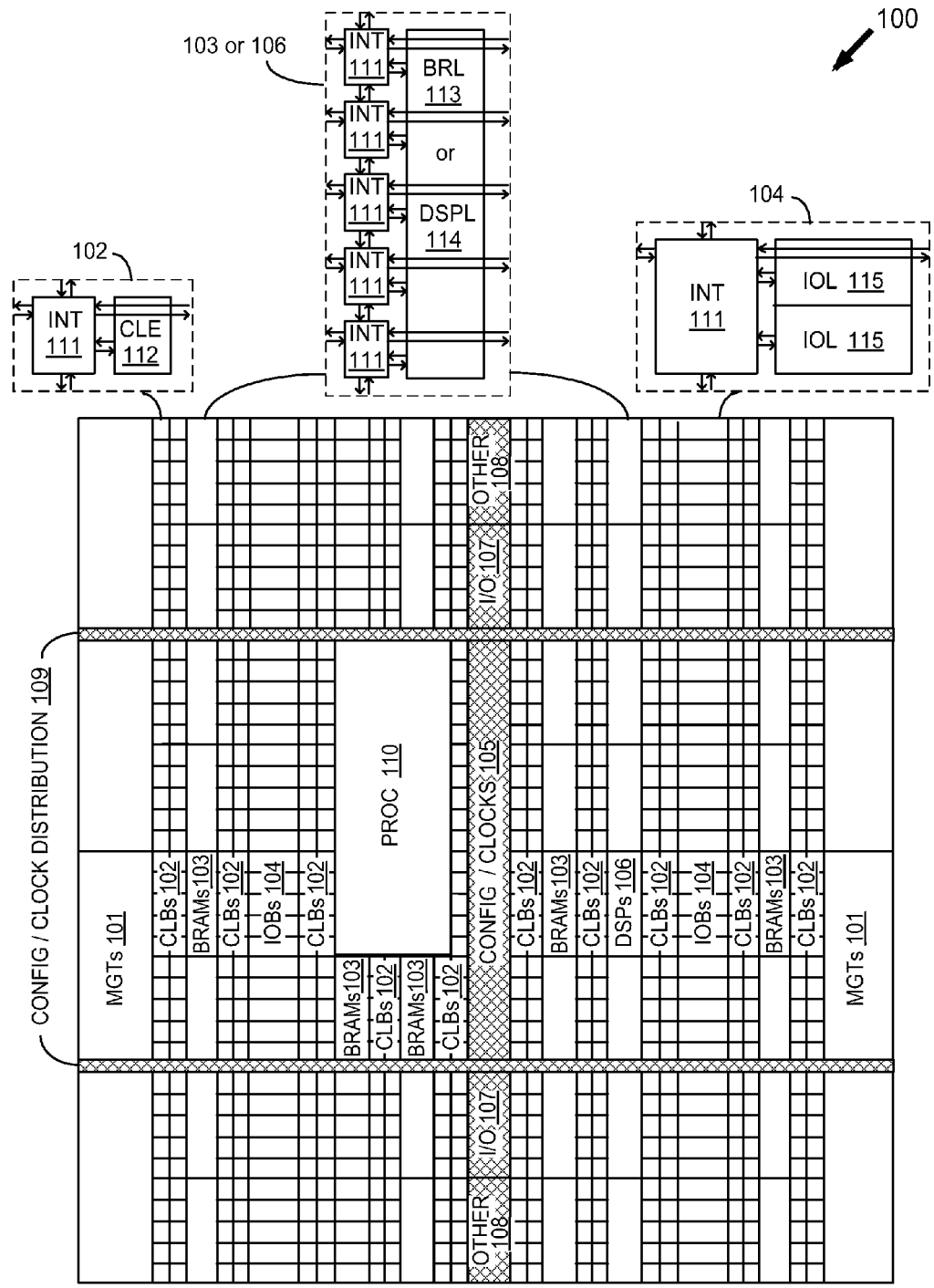
FIG. 1 is block diagram of a programmable logic device configurable to implement relocatable circuits in accordance with various embodiments of the invention.

By way of example, FIG. 1 is block diagram of a Field Programmable Gate Array (FPGA) that contains logic that is configurable to implement relocatable circuits in accordance with various embodiments of the present invention.

Advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Various embodiments of the invention provide a relocatable circuit that can be located anywhere in the address space of a processor. In one embodiment, the relocatable circuit can be mapped anywhere in the address space without modifying the implementation of the relocatable circuit. Multiple instances of the relocatable circuit can be mapped to different portions of the address space using the same implementation of the relocatable circuit. The relocatable circuit can be relocated anywhere in the address space. The relocatable circuit can be relocated statically during initialization of the system in one embodiment, and the relocatable circuit can be relocated dynamically during operation of the system in another embodiment.

In one embodiment, each instance of the relocatable circuit has a corresponding interface circuit that maps a portion of the address space of the processor to a fixed address space of the relocatable circuit. An example of the fixed address space of the relocatable circuit is that of a bus peripheral in which the bus peripheral performs its own address decoding. The interface circuit translates the address of certain accesses from the processor to the fixed address space of the relocatable circuit. The interface circuit handles the processor address space dependencies and makes the implementation of the relocatable circuit independent from the portion of the address space that is assigned to the interface circuit.

In one embodiment, multiple instances of the relocatable circuit are implemented in the programmable logic and interconnect resources of a PLD. Each instance is implemented in a corresponding region or area of the programmable logic and interconnect resources. Thus, in addition to the relocatable circuit being relocatable within the address space of the processor, the relocatable circuit is relocatable for implementation in various regions within the programmable logic and interconnect resources. In an embodiment in which the fixed address space of the relocatable circuit is the same for all instances that are implemented on the PLD, the same basic configuration bitstream that implements a relocatable circuit can be used in deploying multiple instances in different regions of the PLD where each region has a dedicated interface circuit.

Figure 2:
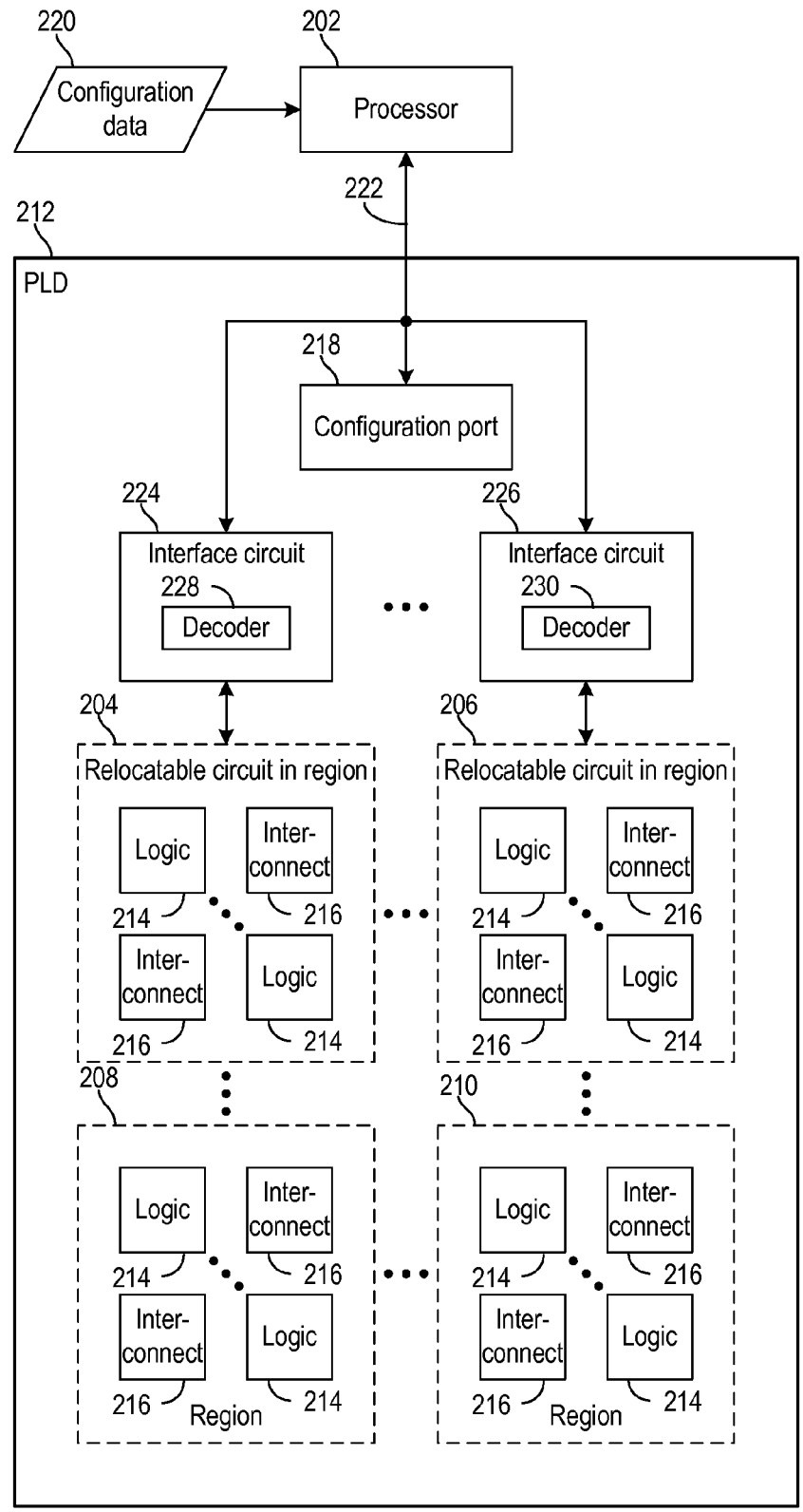
FIG. 2 is a block diagram of a system including relocatable circuits in accordance with various embodiments of the invention.

FIG. 2 is a block diagram of a system including relocatable circuits in accordance with various embodiments of the invention. Each relocatable circuit is relocatable within the address space of processor 202 and relocatable for implementation in any of regions 204, 206, 208, or 210 of the PLD 212.

Each region 204, 206, 208, or 210 includes programmable logic resources 214 and programmable interconnect resources 216. In one embodiment, programmable logic resources 214 correspond to configurable logic elements 112 of FIG. 1 and programmable interconnect resources 216 correspond to programmable interconnect elements 111 of FIG. 1. Each region 204, 206, 208, or 210 corresponds to one or more columns of the CLBs 102 of FIG. 1 in one embodiment. It will be appreciated that the number of columns of these CLBs in each region can vary to match the amount of resources required to implement the relocatable circuit.

In one embodiment, processor 202 configures the resources 214 and 216 of the regions 204, 206, 208, or 210 via configuration port 218. For example, processor 202 configures regions 204 and 206 with configuration data 220 by transferring the configuration data 220 to regions 204 and 206 via configuration port 218.

In one embodiment, the configuration data 220 is a single copy of configuration data for implementing every instance of a relocatable circuit. The processor 202 configures the resources 214 and 216 in region 204 with the configuration data 220 for implementing one instance of the relocatable circuit, and the processor 202 configures the resources 214 and 216 in region 206 with the same configuration data 220 for implementing another instance of the relocatable circuit. Thus, regions 204 and 206 both implement a relocatable circuit implemented from a single copy of the configuration data 220. The processor 202 successively configures regions 204 and 206 by reading configuration data 220 twice in one embodiment, and the processor 202 configures regions 204 and 206 in parallel by reading configuration data 220 only once in another embodiment.

The processor 202 has an interface bus on line 222 for issuing read and write transactions to an address space. Each write transaction includes an address within the address space for identifying the destination for data included in the write transaction. Each read transaction includes an address within the address space for identifying the source of data returned to processor 202. The processor 202 can exchange data with the configuration port 218 and the interface circuits 224 and 226 via the interface bus on line 222.

Interface circuit 224 includes a decoder 228 that determines whether a transaction on the interface bus on line 222 accesses the relocatable circuit that is instantiated in region 204. If the address from the transaction is in the portion of the address space assigned to this instance of the relocatable circuit, then decoder 228 translates or maps the address into the fixed address space of the relocatable circuit. The interface circuit 224 forwards the translated transaction to the instance of the relocatable circuit that is implemented in region 204. If the address from the transaction is not in the portion of the address spaced assigned to this instance of the relocatable circuit, then interface circuit 224 does not forward the transaction. Interface circuit 226 and decoder 230 operate similarly.

In one embodiment, the interface circuits 224 and 226 are implemented in the resources 214 and 216. In one example, interface circuits 224 and 226 are both implemented in the resources 214 and 216 of region 208. Multiple interface circuits may be preconfigured on the PLD prior to detecting the need for any relocation. One or more of the interface circuits may initially be unused for an instance of a relocatable circuit. When the processor address space is to be reapportioned, such as when an additional bus peripheral is desired, an instance of the relocatable circuit can be implemented in the region coupled to one of the unused interface circuits.

Processor 202 is external to the PLD 212 as shown in one embodiment, and in another embodiment the processor 110 is implemented in dedicated circuitry as shown in FIG. 1. In yet another embodiment, the processor is implemented in the resources 214 and 216. For example, the processor is implemented in the resources 214 and 216 of regions 208 and 210. The processor is a dedicated state machine for configuring PLD 212 in an additional embodiment.

Figure 3:
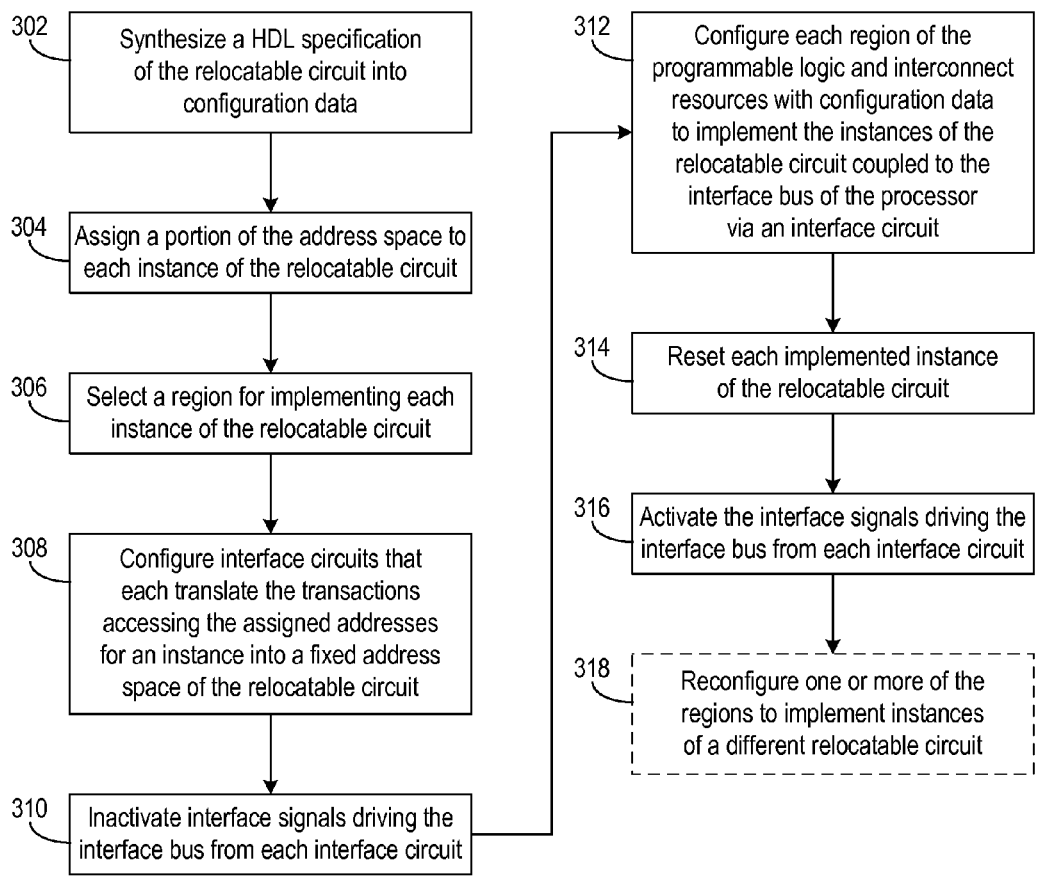
FIG. 3 is a flow diagram of a process for implementing relocatable circuits in accordance with various embodiments of the invention.

FIG. 3 is a flow diagram of a process for implementing relocatable circuits in accordance with various embodiments of the invention. Configuration data is generated from a specification of the relocatable circuit and one or more instances of the relocatable circuit are implemented in correspondingly selected regions.

At step 302, a specification of the relocatable circuit is synthesized to generate configuration data for implementing the relocatable circuit. In one embodiment, the specification specifies the function of the relocatable circuit in a hardware description language (HDL).

At step 304, each instance of the relocatable circuit is assigned a corresponding portion of the address space of a processor. At step 306, respective regions of programmable logic and interconnect resources are selected for implementing the instances of the relocatable circuit.

At step 308, the interface circuits for the instances of the relocatable circuit are configured. Each interface circuit is configured to forward certain processor transactions to a corresponding instance of the relocatable circuit. Each interface circuit is configured to translate the transactions that access the assigned addresses for an instance into the fixed address space of the relocatable circuit.

During configuration of the regions to implement the relocatable circuits, the regions can generate indeterminate values. At step 310, the processor inactivates the signals of the interface bus that are driven by the interface circuits. This prevents the interface circuits from driving indeterminate values onto the interface bus during configuration of the regions.

At step 312, each region is configured to implement a corresponding instance of the relocatable circuit. The programmable logic and interconnect resource in the region are configured with configuration data. The configuration data implements an instance of the relocatable circuit and also couples the instance of the relocatable circuit to a corresponding interface circuit. The processor can access the fixed address space of each instance of the relocatable circuit via an interface bus and the corresponding interface circuit.

At step 314, the processor resets each instance of the relocatable circuit. At step 316, the interface signals, which were inactivated at step 310, are reactivated.

At optional step 318, one or more of the regions are reconfigured to implement a different relocatable circuit. This dynamic reconfiguration includes steps corresponding to step 302 through 316 in one embodiment.

Figure 4:
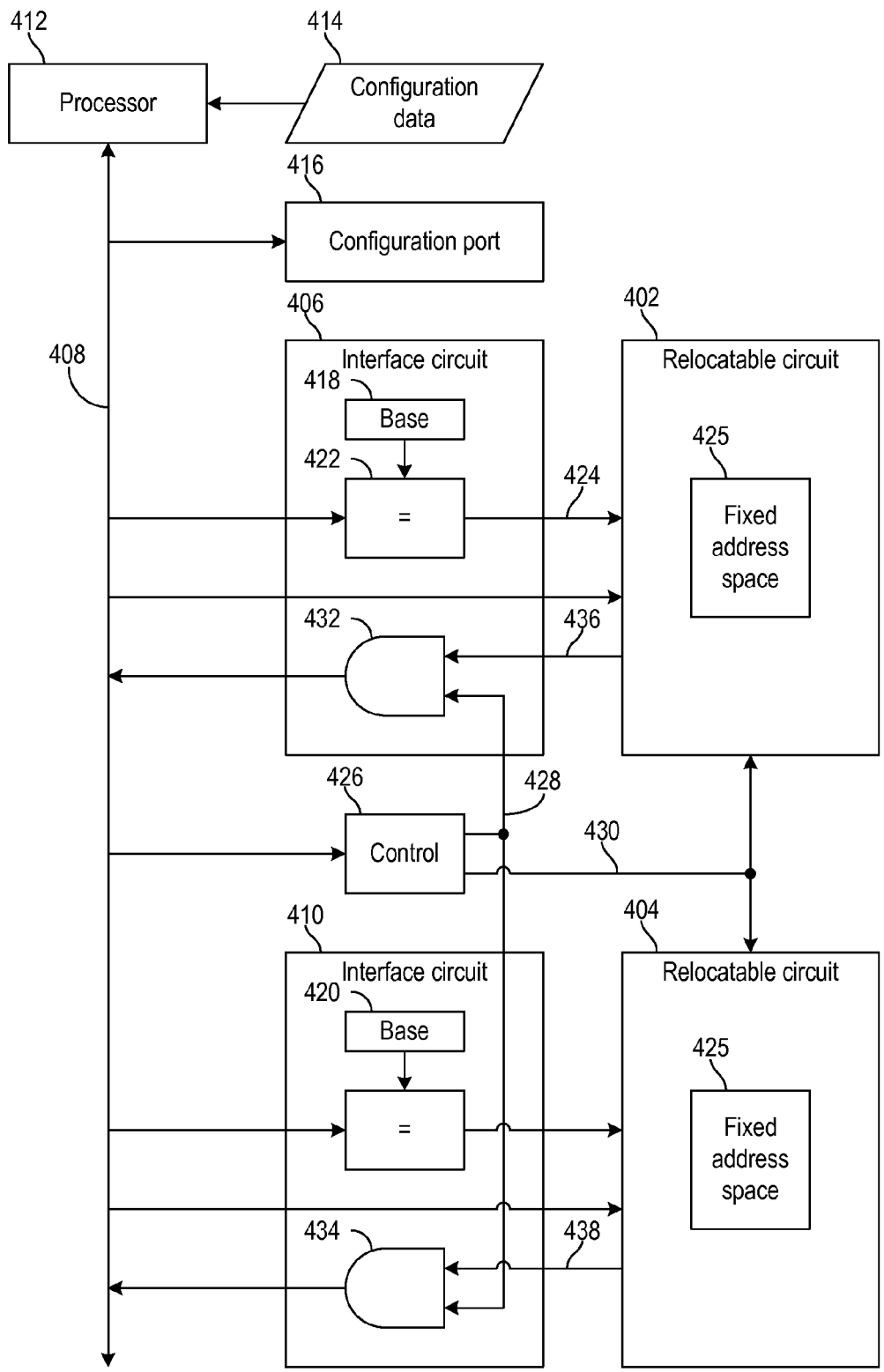
FIG. 4 is a block diagram illustrating relocatable circuits in accordance with various embodiments of the invention.

FIG. 4 is a block diagram illustrating relocatable circuits 402 and 404 in accordance with various embodiments of the invention. Relocatable circuit 402 has a corresponding interface circuit 406 for coupling relocatable circuit 402 to an interface bus on line 408. Similarly, interface circuit 410 couples relocatable circuit 404 to the interface bus on line 408.

Processor 412 implements relocatable circuits 402 and 404 by transferring configuration data 414 via configuration port 416 to programmable logic and interconnect resources in respective regions for relocatable circuits 402 and 404. In one embodiment, processor 412 reformats the configuration data 414 into a configuration bitstream before transferring the bitstream to the appropriate programmable logic and interconnect resources via the interface bus on line 408 and the configuration port 416. In particular, since a configuration bitstream may include the physical addresses that reference resources in the programmable logic to be configured, reformatting the configuration data to implement the relocatable circuit may include the modification or insertion of those physical addresses.

Processor 412 also configures the interface circuits 406 and 410. In one embodiment, processor 412 configures the interface circuits 406 and 410 by transferring additional configuration data to certain programmable logic and routing resources. This additional configuration data implements the interface circuits 406 and 410 in these programmable logic and routing resources. In another embodiment, processor 412 configures interface circuits 406 and 410 by initializing a base 418 in interface circuit 406 and base 420 in interface circuit 410. In yet another embodiment, processor 412 configures interface circuits 406 and 410 by both configuring certain programmable resources for implementing the interface circuits and initializing bases 418 and 420 in these interface circuits 406 and 410.

In one embodiment, base 418 is a register writable by processor 412 for setting the base address of the portion of the address space assigned to relocatable circuit 402. Decoder 422 compares the address of a transaction from the interface bus on line 408 with the value of the register for the base 418. For example, decoder 422 compares the register value with the more significant bits of the address, and if the register value matches the more significant bits of the address, then the address is within the portion of the address space assigned to relocatable circuit 402. Decoder 422 forwards the transaction with the matching address to the relocatable circuit 402 by truncating the more significant bits of the address and forwarding only the less significant bits of the address on line 424. These less significant bits of the address define a fixed address space 425 of the relocatable circuit 402 that is smaller than the address space of the processor 412.

In another embodiment, base 418 is a constant defined in an HDL specification of the interface circuit 406. For example, decoder 422 includes an AND gate having a respective input for each of the more significant bits of the address of a transaction from the interface bus on line 408. The AND gate receives either the value of each of these address bits or the complemented value of each of these address bits. The value of base 418 determines whether decoder 422 uses the true or complemented value of each of the more significant address bits.

Control circuit 426 generates an enable signal on line 428 and a reset signal on line 430. The processor can control the state of the signals on lines 428 and 430. Before configuring programmable logic and interconnect resources to implement relocatable circuits 402 and/or 404, processor 412 directs control circuit 426 to set the enable signal on line 428 to a disabled value of zero. Because the value on line 428 is zero, AND gates 432 and 434 prevent any indeterminate values on lines 436 and 438 from propagating to the interface bus on line 408. It will be apparent to those skilled in the art that alternative embodiments can drive the interface signals to any value, as required by the interface bus.

After the relocatable circuits 402 and 404 are implemented in the appropriate programmable resources, processor 412 directs the control circuit 426 to generate a reset on line 430. After resetting relocatable circuits 402 and 404, processor 412 directs control circuit 426 to set the enable signal on line 428 to an enabled value of one. Consequently, relocatable circuits 402 and 404 can drive signals of the interface bus 408 via AND gates 432 and 434.

Figure 5:
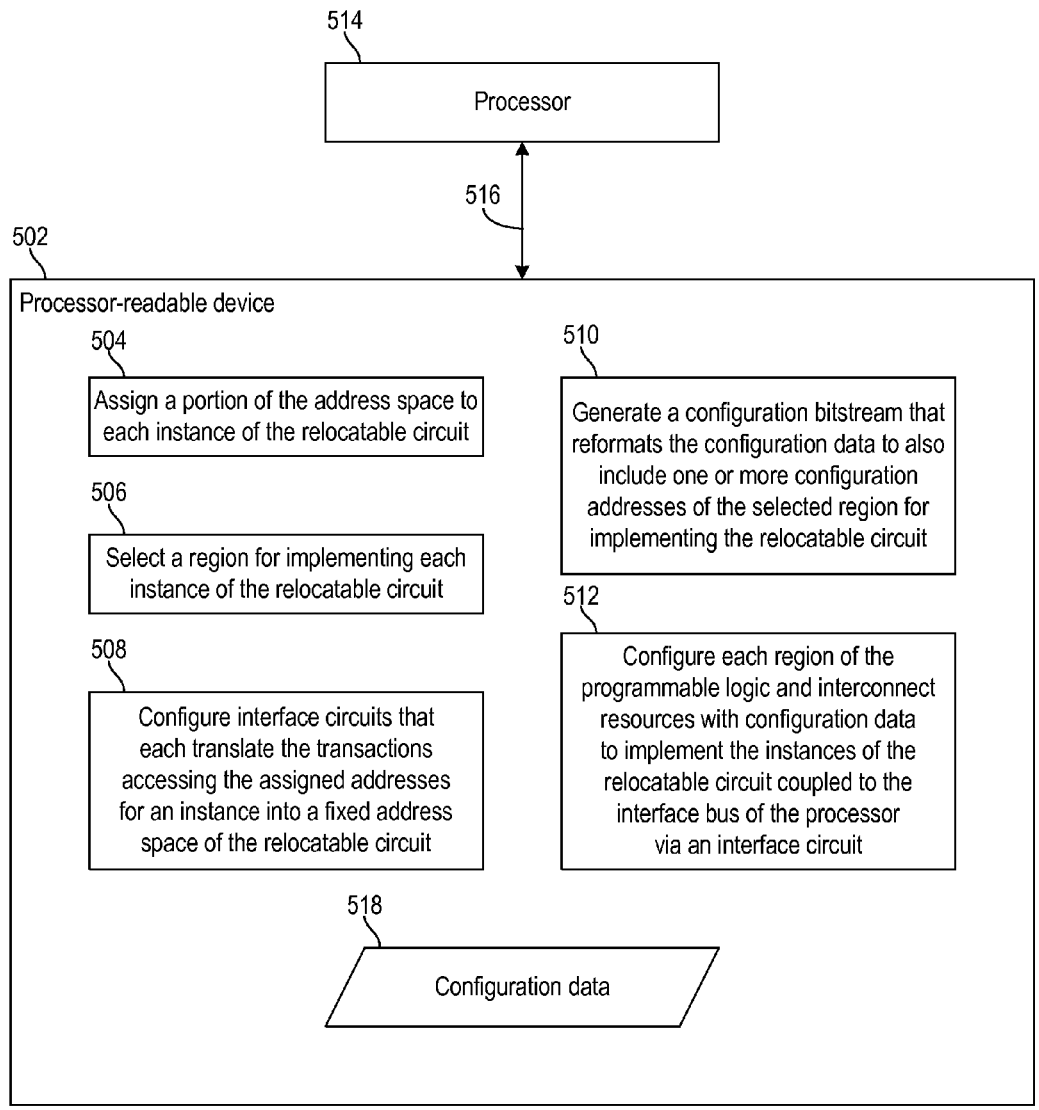
FIG. 5 is a block diagram of a system for implementing relocatable circuits in accordance with various embodiments of the invention.

FIG. 5 is a block diagram of a system for implementing relocatable circuits in accordance with various embodiments of the invention. A processor-readable device 502 is configured with software modules 504, 506, 508, 510, and 512 for configuring one or more programmable logic devices to implement one or more instances of a relocatable circuit.

Execution of the instructions of software module 504 causes processor 514 to assign a portion of the address space of processor 514 to each instance of the relocatable circuit. Execution of the instructions of software module 506 causes processor 514 to select a region of programmable resources for each instance of the relocatable circuit.

Execution of the instructions of software module 508 causes processor 514 to configure the interface circuits. Each interface circuit is configured to translate the transactions accessing the assigned portion of the address space for the interface circuit. Such transactions are translated into the fixed address space of the relocatable circuit.

Execution of the instructions of software module 510 causes processor 514 to generate a configuration bitstream for implementing each instance of the relocatable circuit. The configuration data is reformatted to also include one or more configuration addresses of the selected region for implementing each relocatable circuit. For example, a region may correspond to one or more columns of CLBs 102 as shown in FIG. 1, and the configuration addresses identify each column of the region.

Execution of the instructions of software module 512 causes processor 514 to configure each selected region with configuration data that implements an instance of the relocatable circuit. Each instance of the relocatable circuit is implemented to be coupled via an interface circuit to the interface bus 516 of processor 514. In one embodiment, the configuration data is configuration data 518 stored in processor-readable device 502.

Figure 6:
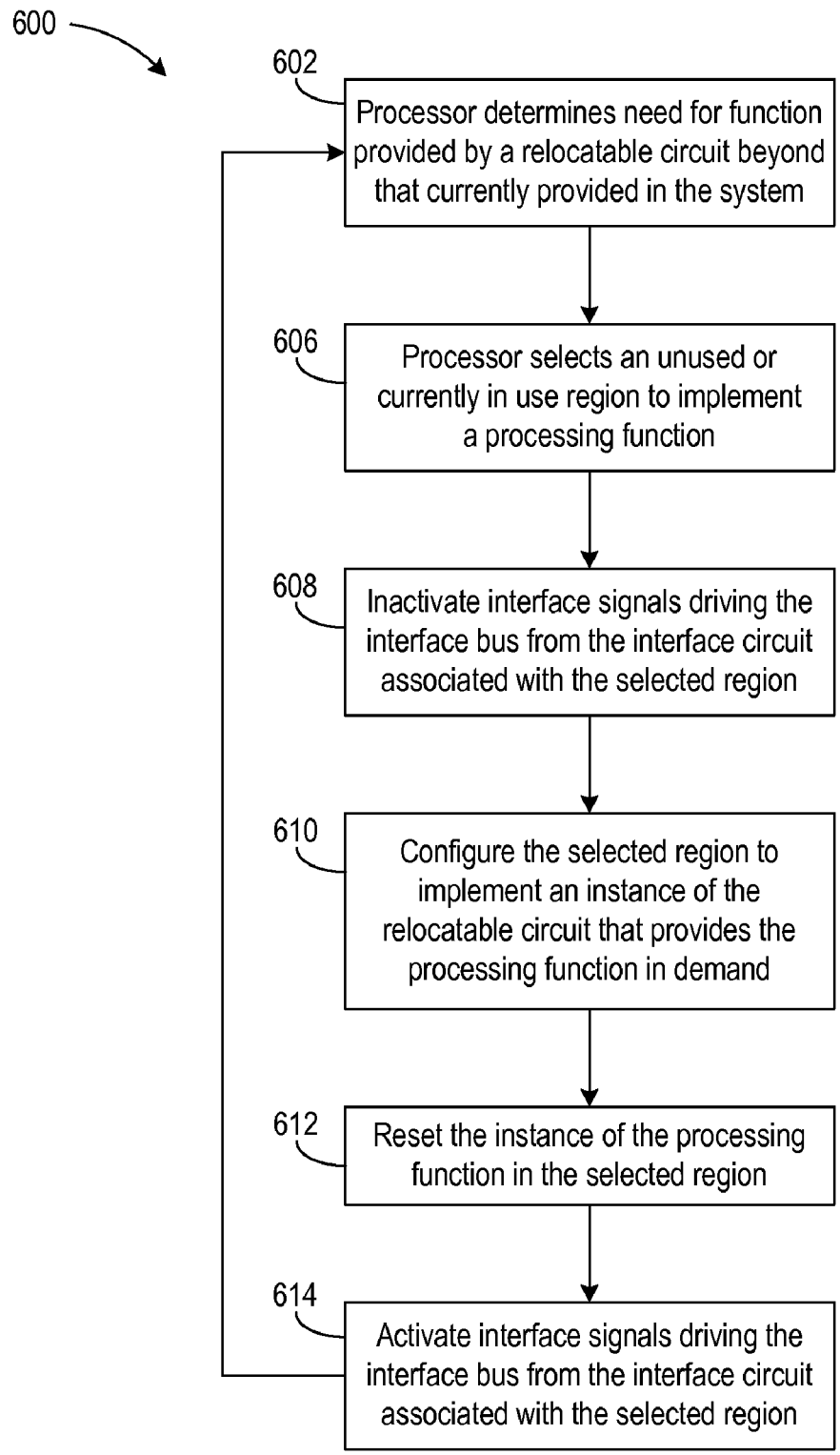
FIG. 6 is a flow diagram of a process for reconfiguring relocatable circuits in accordance with various embodiments of the invention.

FIG. 6 is a flow diagram of a process 600 for reconfiguring relocatable circuits in accordance with various embodiments of the invention. In an example embodiment, a PLD is configured with one or more interface circuits initially being unused for an instance of a relocatable circuit. One or more others of the interface circuits may be coupled to an instance of the relocatable circuit. The interface circuits are configured prior to the monitoring and partial reconfiguring of process 600, which provides the relocatability of the relocatable circuit within the processor address space and between regions of the PLD.

At step 602, the processor determines there is a need for the function provided by a relocatable circuit and the system in its present state is not able to provide the function. For example, the need may be detected as part of monitoring the demand for various processing functions, such as the function provided by a relocatable circuit. If there is a greater demand for the function provided by one instance of the relocatable circuit, an additional instance of that relocatable circuit may be deployed. In another application, there may be a greater demand for the function of a first relocatable circuit and a reduced demand for the function of a second, different relocatable circuit, and an instance of the first relocatable circuit may displace the instance of the second relocatable circuit from a region of the PLD. Whether the level of change merits partial reconfiguration of the PLD is application dependent. In an alternative embodiment, at system startup, the processor may configure instances of a plurality of relocatable circuit instances selected from a library of relocatable circuits, based on the expected workload of the system. Such a library may be shared between different applications with different expected workloads.

At step 606, the processor selects an unused or currently used region to implement the processing function with an instance of the relocatable circuit. If an unused region is not available, the processor may select the region implementing a processing function having relatively reduced demand.

At step 608, the processor inactivates the signals of the interface bus that are driven by the interface circuit associated with the selected region. This prevents the interface circuit from driving indeterminate values onto the interface bus during reconfiguration of the selected region.

At step 610, the processor reconfigures the selected region to implement an instance of the relocatable circuit. The selected region is configured to couple the instance of the relocatable circuit to the associated interface circuit. Since the associated interface circuit had already been preconfigured into the PLD for coupling to the region, the instance of the relocatable circuit may be readily implemented in the selected region. The processor can thereafter access the fixed address space of the instance via the interface bus and the associated interface circuit.

At step 612, the processor resets the instance of the relocatable circuit, and at step 614, the processor reactivates the interface signals that were inactivated at step 608.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable storage media or delivery channels such as magnetic or optical disks or tapes, electronic storage devices, or as application services over a network.

The present invention is thought to be applicable to a variety of systems for implementing relocatable circuits. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for configuring at least one portion of programmable logic in an integrated circuit device to implement a plurality of instances of a relocatable circuit, comprising:
   for each of the instances of the relocatable circuit, assigning a respective portion of an address space of a processor to the instance of the relocatable circuit, wherein the processor accesses the address space with read and write transactions issued on an interface bus;
   for each of the instances of the relocatable circuit, configuring a respective interface circuit for translating the transactions accessing the respective portion of the address space into a fixed address space of the relocatable circuit;
   wherein the relocatable circuit is independent of the respective portions of the address space assigned to the instances of the relocatable circuit;
   for each of the instances of the relocatable circuit, selecting a respective one of a plurality of regions within an array of programmable logic and interconnect resources of the integrated circuit device;
   wherein each region is configurable to implement an instance of the relocatable circuit; and
   configuring the programmable logic and interconnect resources to implement the instances of the relocatable circuit and to couple each of the instances to the interface bus of the processor via the respective interface circuit;
   wherein the configuring includes the processor configuring the programmable logic and interconnect resources in the respective regions to implement the instances from a single copy of configuration data for implementing the relocatable circuit.

2. The method of claim 1, wherein:
   the configuring of the respective interface circuit for each of the instances of the relocatable circuit includes the processor writing a base register of the respective interface circuit with a value specifying whether an address of each transaction is included in the respective portion of the address space assigned to the instance in response to the address having a more significant part that matches the value; and
   the relocatable circuit has the fixed address space that corresponds to a less significant part of the address in response to the more significant part matching the value.

3. The method of claim 1, wherein the configuring of the respective interface circuit for each of the instances of the relocatable circuit includes:
   specifying a base address of the instance in a specification of the respective interface circuit in a hardware description language;
   synthesizing the specification into configuration data; and
   configuring the programmable logic and interconnect resources of the integrated circuit device with the configuration data to implement the respective interface circuit.

4. The method of claim 1, wherein the configuring of the programmable logic and interconnect resources includes, for each of the instances of the relocatable circuit:
   the processor generating a configuration bitstream from the single copy of the configuration data and at least one configuration address of the respective region within the array of programmable logic and interconnect resources of the integrated circuit device; and
   the processor configuring the programmable logic and interconnect resources in the respective region to implement the instance with the configuration bitstream.

5. The method of claim 1, further comprising synthesizing a specification of the relocatable circuit in a hardware description language only once for creating the single copy of the configuration data for all of the instances of the relocatable circuit.

6. The method of claim 1, further comprising:
   the processor controlling an enable signal to inactivate a plurality of interface signals driven from the respective interface circuits to the interface bus before the configuring of the programmable logic and interconnect resources;
   the processor controlling a reset signal to reset the instances of the relocatable circuit after the configuring of the programmable logic and interconnect resources; and
   the processor controlling the enable signal to reactivate the interface signals after the reset of the instances of the relocatable circuit.

7. A system, comprising:
   an interface bus;
   an integrated circuit device coupled to the interface bus; and
   a processor coupled to the interface bus,
   wherein the processor is coupled to:
      for each of a plurality of instances of a relocatable circuit, assign a respective portion of an address space of the processor to the instance of the relocatable circuit, wherein the processor accesses the address space with read and write transactions issued on the interface bus;
      for each of the instances of the relocatable circuit, configure a respective interface circuit for translating the read and write transactions accessing the respective portion of the address space into a fixed address space of the relocatable circuit;

wherein the relocatable circuit is independent of the respective portions of the address space assigned to the instances of the relocatable circuit;

for each of the instances of the relocatable circuit, select a respective one of a plurality of regions within an array of programmable logic and interconnect resources of the integrated circuit device;

wherein each region is configurable to implement an instance of the relocatable circuit; and configure the programmable logic and interconnect resources to implement the instances of the relocatable circuit and to couple each of the instances to the interface bus via the respective interface circuit;

wherein the configuring includes the processor configuring the programmable logic and interconnect resources in the respective regions to implement the instances from a single copy of configuration data for implementing the relocatable circuit.

8. The system of claim 7, wherein:

the processor being coupled to configure the respective interface circuit for each of the instances of the relocatable circuit includes the processor being coupled to write a base register of the respective interface circuit with a value specifying whether an address of each transaction is included in the respective portion of the address space assigned to the instance in response to the address having a more significant part that matches the value; and the relocatable circuit has the fixed address space that corresponds to a less significant part of the address in response to the more significant part matching the value.

9. The system of claim 7, wherein the processor being coupled to configure the respective interface circuit for each of the instances of the relocatable circuit includes the processor being coupled to:

specify a base address of the instance in a specification of the respective interface circuit in a hardware description language;

synthesize the specification into configuration data; and configure the programmable logic and interconnect resources of the integrated circuit device with the configuration data to implement the respective interface circuit.

10. The system of claim 7, wherein the processor being coupled to configure the programmable logic and interconnect resources includes, for each of the instances of the relocatable circuit, the processor being coupled to:

generate a configuration bitstream from the single copy of the configuration data and at least one configuration address of the respective region within the array of programmable logic and interconnect resources of the integrated circuit device; and configure the programmable logic and interconnect resources in the respective region to implement the instance with the configuration bitstream.

11. The system of claim 7, wherein the single copy of configuration data for implementing the relocatable circuit is created by synthesizing a specification of the relocatable circuit in a hardware description language only once for all of the instances of the relocatable circuit.

12. The system of claim 7, wherein the processor is further coupled to:

control an enable signal to inactivate a plurality of interface signals driven from the respective interface circuits to the interface bus before the configuring of the programmable logic and interconnect resources;

control a reset signal to reset the instances of the relocatable circuit after the configuring of the programmable logic and interconnect resources; and control the enable signal to reactivate the interface signals after the reset of the instances of the relocatable circuit.

13. A system, comprising:

an interface bus;

an integrated circuit device coupled to the interface bus, the integrated circuit device comprising programmable logic;

a processor coupled to the interface bus; and a processor-readable device coupled to the processor, the processor-readable device storing instructions causing the processor to perform operations including:

for each of a plurality of instances of a relocatable circuit, assigning a respective portion of an address space of the processor to the instance of the relocatable circuit, wherein the processor accesses the address space with read and write transactions issued on the interface bus;

for each of the instances of the relocatable circuit, configuring a respective interface circuit for translating the read and write transactions accessing the respective portion of the address space into a fixed address space of the relocatable circuit;

wherein the relocatable circuit is independent of the respective portions of the address space assigned to the instances of the relocatable circuit;

for each of the instances of the relocatable circuit, selecting a respective one of a plurality of regions within an array of programmable logic and interconnect resources of the integrated circuit device;

wherein each region is configurable to implement an instance of the relocatable circuit; and configuring the programmable logic and interconnect resources to implement the instances of the relocatable circuit and to couple each of the instances to the interface bus via the respective interface circuit;

wherein the configuring includes the processor configuring the programmable logic and interconnect resources in the respective regions to implement the instances from a single copy of configuration data for implementing the relocatable circuit.

14. The system of claim 13, wherein the processor-readable device further comprises the single copy of configuration data for implementing the relocatable circuit.

15. The system of claim 13, wherein:

the operation of configuring the respective interface circuit for each of the instances of the relocatable circuit includes the processor writing a base register of the respective interface circuit with a value specifying whether an address of each transaction is included in the respective portion of the address space assigned to the instance in response to the address having a more significant part that matches the value; and the relocatable circuit has the fixed address space that corresponds to a less significant part of the address in response to the more significant part matching the value.

16. The system of claim 13, wherein the operation of configuring the respective interface circuit for each of the instances of the relocatable circuit includes:

specifying a base address of the instance in a specification of the respective interface circuit in a hardware description language;

synthesizing the specification into configuration data; and configuring the programmable logic and interconnect resources of the integrated circuit device with the configuration data to implement the respective interface circuit.

17. The system of claim 13, wherein the operation of configuring the programmable logic and interconnect resources includes, for each of the instances of the relocatable circuit:
  generating a configuration bitstream from the single copy of the configuration data and at least one configuration address of the respective region within the array of programmable logic and interconnect resources of the integrated circuit device; and
  configuring the programmable logic and interconnect resources in the respective region to implement the instance with the configuration bitstream.

18. The system of claim 13, wherein the operations further comprise synthesizing a specification of the relocatable circuit in a hardware description language only once for creating the single copy of the configuration data for all of the instances of the relocatable circuit.

19. The system of claim 13, wherein the operations further comprise:
  controlling an enable signal to inactivate a plurality of interface signals driven from the respective interface circuits to the interface bus before the configuring of the programmable logic and interconnect resources;
  controlling a reset signal to reset the instances of the relocatable circuit after the configuring of the programmable logic and interconnect resources; and
  controlling the enable signal to reactivate the interface signals after the reset of the instances of the relocatable circuit.

* * * * *